US007398505B2

(12) United States Patent
Fredrickson et al.

(10) Patent No.: US 7,398,505 B2
(45) Date of Patent: Jul. 8, 2008

(54) AUTOMATIC BACK ANNOTATION OF A FUNCTIONAL DEFINITION OF AN INTEGRATED CIRCUIT DESIGN BASED UPON PHYSICAL LAYOUT

(75) Inventors: Mark S. Fredrickson, Rochester, MN (US); Glen Howard Handlogten, Rochester, MN (US); Chad B. McBride, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 128 days.

(21) Appl. No.: 11/348,877

(22) Filed: Feb. 7, 2006

(65) Prior Publication Data

US 2007/0186204 A1    Aug. 9, 2007

(51) Int. Cl.
*G06F 17/50* (2006.01)
(52) U.S. Cl. ............................................. 716/18; 716/2
(58) Field of Classification Search ..................... 716/2, 716/16–18
See application file for complete search history.

(56) References Cited

U.S. PATENT DOCUMENTS

| | | | | |
|---|---|---|---|---|
| 6,324,678 B1 * | 11/2001 | Dangelo et al. | ............... | 716/18 |
| 6,857,110 B1 * | 2/2005 | Rupp et al. | ..................... | 716/4 |
| 7,162,706 B2 * | 1/2007 | Kuang et al. | ................... | 716/6 |
| 2002/0162086 A1 * | 10/2002 | Morgan | ....................... | 716/18 |
| 2004/0225984 A1 | 11/2004 | Tsao et al. | | |

FOREIGN PATENT DOCUMENTS

WO        WO0143166        6/2001

OTHER PUBLICATIONS

Kahng A. B., et al., "Practical Bounded-Skew Clock Routing", Journal of VLSI Signal Processing Systems for Signal, Image, and Video Technology, Jun. 1997, pp. 199-215, vol. 16, No. 2/3, Sprinter, New York, NY, USA.
Mike Wright, "Experiments with a Plateau-Rich Solution Space", MIC 2001, 4th Metaheuristics International Conference, Jul. 2001, pp. 317-320, Portugal.
Yip, K. "Clock Tree Distribution", IEEE Potentials, IEEE, Apr. 1997, pp. 11-14, vol. 16, No. 2, New York, NY, USA.

(Continued)

*Primary Examiner*—Jack Chiang
*Assistant Examiner*—Binh Tat
(74) *Attorney, Agent, or Firm*—Wood, Herron & Evans, LLP

(57) ABSTRACT

An apparatus, program product and method automatically back annotate a functional definition of a circuit design based upon the physical layout generated from the functional definition. A circuit design may be back annotated, for example, by generating a plurality of assignments between a plurality of circuit elements in the circuit design and a plurality of signals defined for the circuit design using a physical definition of the circuit design that has been generated from the functional definition, and modifying the functional definition of the circuit design to incorporate the plurality of assignments into the functional definition.

18 Claims, 4 Drawing Sheets

OTHER PUBLICATIONS

Bonhomme Y., et al., "Design of Routing-Constrained Low Power Scan Chains", Electronic Design, Test and Applications, Second IEEE International Workshop on Perth Australia, Jan. 2004, pp. 1-6, Piscataway, NJ, USA.

Liyang Lai, et al., "Logic BIST with Scan Chain Segmentation", 2004 International Conference on Charlotte, NC, Oct. 26, 2004, pp. 57-66, Piscataway, NJ, USA.

Berthelot D., et al., "An Efficient Linear Time Algorithm for Scan Chain Optimization and Repartitioning", Proceedings International Test Conference 2002, pp. 781-787, Baltimore, MD, USA.

Dong-Sup Song et al., "Increasing Embedding Probabilities of RPRPs in RIN Based BIST", pp. 600-613, 2005, Springer Berlin Heidelberg.

\* cited by examiner

AUTOMATIC BACK ANNOTATION OF A FUNCTIONAL DEFINITION OF AN INTEGRATED CIRCUIT DESIGN BASED UPON PHYSICAL LAYOUT

CROSS-REFERENCE TO RELATED APPLICATIONS

This application is related to U.S. application Ser. No. 11/348,970, entitled "HEURISTIC CLUSTERING OF CIRCUIT ELEMENTS IN A CIRCUIT DESIGN", and U.S. application Ser. No. 11/348,907, entitled "TRADING PROPENSITY-BASED CLUSTERING OF CIRCUIT ELEMENTS IN A CIRCUIT DESIGN", both filed on even date herewith, which applications are incorporated by reference herein.

FIELD OF THE INVENTION

The invention relates to computers and computer software, and in particular, to computer software used in integrated circuit device design.

BACKGROUND OF THE INVENTION

Integrated circuit devices, commonly known as chips, continue to become more powerful and complex as semiconductor manufacturing technologies have advanced. Whereas early integrated circuit devices included fewer than one hundred transistors, it is now common to integrate millions of transistors into a single integrated circuit device. This increased transistor count enables some operations that once required several integrated circuit devices to now be implemented in a single integrated circuit device, often providing greater performance at a lower cost. For example, where previously a data processing system might require separate integrated circuit devices for a microprocessor, a memory, a bus interface, and a memory controller, advances in chip density now permit all of these functions to be integrated into the same integrated circuit device. Such devices are typically known as "systems on a chip" due to the high level of integration they provide.

Increases in chip density have also significantly affected the design methodologies used for integrated circuit chips. Rather than manually laying out individual transistors or logic gates in a design to obtain a desired logic function, typically the functional aspects of the design process are separated from the physical aspects. The functional aspects of a design are typically addressed via a process known as a logic design, which results in the generation of a functional definition of a circuit design, typically defined in a hardware description language (HDL) such as VHDL or Verilog. An HDL representation of a circuit is analogous in many respects to a software program, as the HDL representation generally defines the logic or functions to be performed by a circuit design. Moreover, by separating logic design from physical layout, functions are capable of being defined at a higher level of abstraction.

In parallel with the creation of the HDL representation, a physical definition of a circuit design is created typically via a layout process, often referred to as integration, to essentially create a "floor plan" of logic gates and interconnects between the logic gates representing the actual physical arrangement of circuit elements on the manufactured integrated circuit. Automation tools have been developed to utilize predefined cells or blocks of complete circuits to assist with the layout, thus eliminating the need to work with millions of individual logic gates. For example, synthesis tools have been developed to generate Random Logic Macro (RLM) blocks from an HDL representation of a design, whereby an individual laying out a design is merely required to place the RLM blocks and connect them to one another to complete the circuit design. In addition, some designs incorporate blocks from off-the-shelf (OTS) logic blocks, which are reusable from design to design.

Once a physical definition is created, testing and simulation of the design may be performed to identify any potential timing and/or manufacturability issues, and once the design has been determined to meet these requirements, the design may be utilized to manufacture integrated circuits.

As integrated circuits have become more complex, the number of individuals involved in the development and testing processes has increased substantially. Indeed, in many instances the individuals performing the logic design process are completely separate from the integrators who perform the physical design processes. Furthermore, as integrated circuits have become more complex, larger and faster, timing issues become more pronounced, often necessitating the functional definition of a design to be revised after layout has been performed. In many instances, several iterations of reworking a functional definition, updating the physical definition, and retesting the physical definition may be required before timing issues are adequately resolved. With different individuals participating in these different processes, therefore, coordinating the updates to the functional and physical definitions can become problematic and time consuming.

One particular area, for example, where the layout process may require revision of a functional definition is associated with what is referred to herein as overhead logic, i.e., supplemental support circuitry that is not directly involved in the primary logic implemented by a circuit design. For example, in order to provide testability for a manufactured device, most integrated circuit designs include a scan architecture integrated therein with one or more serial chains of latches referred to as scan chains. The latches in a serial chain, or scan path, are designed such that, when configured in a specific mode, the latches together operate as a shift register so that data may be shifted into the chain of latches from a single source to simulate different conditions, and so that data generated within a device may be shifted out through a single output. Thus, with a scan architecture, the current state of various nodes in a device at any given time may be controlled and/or recorded and later accessed via external equipment to verify the operation of a manufactured device.

The latches in a scan chain are coupled together serially, typically with each latch having a scan in port and a scan out port, with the scan in port of each latch being connected to the scan out port of its preceding latch. Whereas less complex circuit designs might include tens or hundreds of latches in a single scan chain, more complex designs, e.g., many SOC designs, may require thousands of latches in a scan architecture. Furthermore, to ensure that the amount of time required to load and unload data into and out of a scan architecture, multiple scan chains are typically used, requiring each latch to be assigned to a specific scan chain, in addition to being assigned to a specific location in the selected scan chain.

Scan architectures may require additional clock control signals to be distributed to the various latches to enable and otherwise configure scan chain operation. With more complex integrated circuit designs, the size and timing constraints imposed on the designs often necessitate the use of distribution trees to distribute clock control signals and other overhead or non-overhead global signals. In a distribution tree, signals are distributed via a tree of latches that repower the signals, shorten effective wire lengths, and reduce fanout issues, while ensuring that the signals arrive at all endpoints at the same time. As a result, similar to the assignment of latches to scan chains, latches are often required to be connected to appropriate signals output from a distribution tree.

As a general design rule, it is desirable to utilize multiple balanced scan chains to reduce the length of each scan chain and thus reduce the amount of time required to test a circuit. Furthermore, it is often desirable to minimize the wire lengths used to connect the latches in a scan chain together, which is typically accomplished by grouping latches that are physically located in close proximity to one another into the same scan chain.

It is often desirable to maintain the assignments of latches to scan chains and distribution trees in a functional definition of a circuit design. With layout performed after logic design, however, the optimal assignment of latches to scan chains, as well as the assignment of latches to signal distribution trees, cannot be ascertained until after the design has been laid out. Often, a logic designer is required to initially connect latches to scan chains and distribution trees manually and based upon little more than educated guessing. Often, as a result of layout and testing, the latch connections must be modified manually to reduce wire lengths and achieve timing requirements. Given the iterative nature of the design process, repeated manual modifications may be required. This, in turn, makes it difficult to freeze the functional definition because the functional definition is dependent on layout changes and visa versa.

With large device integration, maintaining proper assignments becomes significantly problematic. For example, when a register (i.e., a group of latches) is physically moved any significant distance during integration, it often must be connected to a different node of a distribution tree and must be placed into a new position of a (possibly different) scan ring. A typical IP block may have dozens of registers (and as a result, hundreds of latches), each requiring separate distribution tree and scan chain assignments to be made. Some design sizes may yield on the order of 150 different distribution tree signals to choose from depending on the physical location of a register, and may incorporate 25 or more separate scan rings. As a result, the management of assignments can be a significant endeavor.

Increasing device frequencies typically drive more placement instabilities into a design, forcing integrators to make frequent changes to a device's floor plan. Since the connections to the scan architecture are not really a part of the functional logic, these changes are usually made without regard for the consequences on the scan architecture. Thus, the management of scan architecture connections, as well as those to other overhead circuitry in a circuit design, continues to increase in difficulty.

SUMMARY OF THE INVENTION

The invention addresses these and other problems associated with the prior art by providing in one aspect an apparatus, program product and method that automatically back annotate a functional definition of a circuit design based upon the physical layout generated from the functional definition. A circuit design may be back annotated, for example, by generating a plurality of assignments between a plurality of circuit elements in the circuit design and a plurality of signals defined for the circuit design using a physical definition of the circuit design that has been generated from the functional definition, and modifying the functional definition of the circuit design to incorporate the plurality of assignments into the functional definition.

In some embodiments consistent with the invention, for example, a functional definition, e.g., as defined in a hardware definition language, may be automatically back annotated to incorporate assignments of latches to entities in a scan architecture, i.e., specific scan chains and/or specific outputs of one or more clock control distribution trees. Such assignments may take the form, for example, of defined connections between ports defined by the latches and those defined by other latches and/or defined for one or more distribution trees.

In addition, consistent with another aspect of the invention, an execution architecture may be utilized to apply common changes to a plurality of records, e.g., to facilitate back annotation of a functional definition of a circuit design by processing records associated with signals assigned to circuit elements in the circuit design. The execution architecture may process each record by storing the record in a selected data structure among a plurality of data structures, associating a stage identifier, which identifies an initial execution stage among a plurality of execution stages, with the record in the selected data structure, and processing the record by retrieving the record from the selected data structure and passing the record to the execution stage among the plurality of execution stages that is identified by the stage identifier for the record. Furthermore, the execution architecture may, after processing the record, and until the stage identifier for the record indicates that the record has been processed by all of the execution stages, repeatedly increment the stage identifier for the record to identify a next execution stage among the plurality of execution stages, store the record back in the selected data structure, and repeat processing of the record by retrieving the record from the selected data structure and passing the record to the execution stage among the plurality of execution stages that is identified by the stage identifier for the record.

These and other advantages and features, which characterize the invention, are set forth in the claims annexed hereto and forming a further part hereof. However, for a better understanding of the invention, and of the advantages and objectives attained through its use, reference should be made to the Drawings, and to the accompanying descriptive matter, in which there is described exemplary embodiments of the invention.

DETAILED DESCRIPTION

Figure 1:
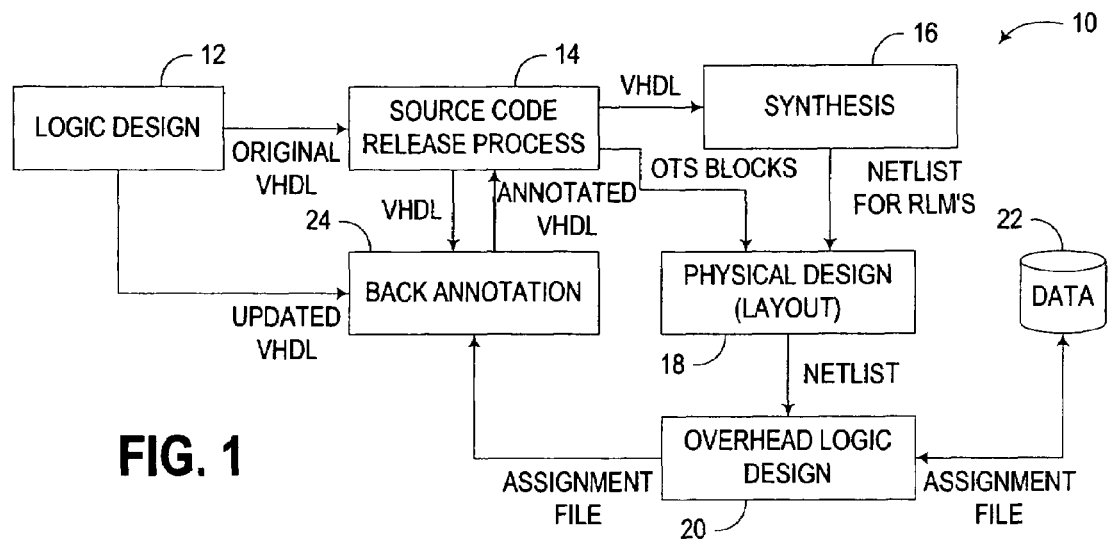
FIG. 1 is a block diagram of an integrated circuit design process incorporating automated back annotation consistent with the invention.

The embodiments discussed hereinafter automatically back annotate a functional definition of a circuit design based upon the physical layout of the circuit design generated from the functional definition. A functional definition within the context of the invention may be implemented, for example, using any number of hardware definition language (HDL) formats, e.g., VHDL, Verilog, etc., and represents all or a portion of the components and connectivity therebetween to implement the desired logic in an integrated circuit device, which may be independent of physical layout.

A circuit design may be back annotated, for example, by generating a plurality of assignments between a plurality of circuit elements in the circuit design and a plurality of signals defined for the circuit design, using a physical definition of the circuit design that has been generated from the functional definition. The physical definition may be implemented, for example, as one or more netlist files, and represents the physical layout of all or a portion of the circuit design.

Assignments may be generated, for example, once a new or revised floor plan has been generated for a circuit design. From this floor plan, optimal connections for each circuit element may be determined by analyzing the floor plan, e.g., using the techniques described in the aforementioned cross-referenced applications. Circuit elements may alternately be referred to herein as cells or components, and it will be appreciated that a circuit element may incorporate circuitry with varied levels of complexity and abstraction, e.g., as small as a single latch or as large as a complex IP block containing hundreds or thousands of logic gates.

Once the assignments are generated, the functional definition may then be modified to incorporate the plurality of assignments into the functional definition. In connection with such modification, new assignments may be added to the functional definition, existing assignments may be modified in the functional definition and/or obsolete assignments may be deleted from the functional definition.

The manner in which assignments may be implemented may vary in different embodiments. For example, assignments may be represented in an assignment file that includes entries or records for each circuit element, such as a cell, an IP block, an RLM, etc. and the assignments to various types of signals. For example, some assignments may be implemented as global signal assignments made to various global signals, such as signals distributed via distribution trees, be it functional signals or signals associated with overhead circuitry such as provided in a scan architecture, e.g., clock control signals such as scan gate signals, thold signals, etc. (where assignments to clock control signals are referred to herein as clock control signal assignments). In this regard, a global signal may be considered to incorporate any signal that is shared across multiple units or partitions of a circuit design using a distribution tree. A global signal assignment typically assigns a latch or other circuit element to a particular endpoint in the distribution tree that distributes a particular global signal.

As another example, some assignments may be implemented as scan chain assignments made to signals such as scan chain inputs and outputs, e.g., to assign a circuit element to a particular scan chain and/or a particular position or stage in a particular scan chain. In connection with such assignments, polarity may also be specified to indicate whether a particular circuit element coupled to a scan chain expects to be initialized to a "0" or "1" value.

Annotation using the generated assignments may incorporate, for example, the generation of connections in the functional definition (e.g., in a VHDL file or other HDL-based representation) between signals and component instances, as well as the removal of obsolete or overridden connections from the functional definition, e.g., via setting a removal flag in the comments generated during a previous back annotation operation. In addition, annotation may also include adding and/or removing ports at various levels of the functional definition (e.g., in the source HDL) based upon the assignments and removal flags. Annotation may also incorporate the connection of scan chains at a top level of the functional definition based upon orders defined by the generated assignments.

By automatically back annotating the functional definition with signal assignments using the physical definition, the process of propagating layout and floor plan changes back into the source functional definition is substantially simplified. Moreover, the automatic back annotation provides the ability to perform feasibility tests, e.g., to determine whether timing issues are raised for overhead circuitry such as scan chains or distribution trees as a result of moving circuit elements to different physical locations in the floor plan of a design. The automatic back annotation also allows overhead circuitry to be incorporated into a chip design at an earlier stage than otherwise has been possible due to the high frequency of changes to the floor plan that inevitably occur during early stages of design.

Turning now to the Drawings, wherein like numbers denote like parts throughout the several views, FIG. 1 illustrates an exemplary integrated circuit design process 10 suitable for implementing automated back annotation consistent with the invention. The design process typically begins with logic design, as shown in block 12, which is typically performed by one or more logic designers using logic design tools, and which results in the generation of a functional definition, e.g., in the form of one or more VHDL files. The VHDL files are typically, but not necessarily, provided to a source code release process 14, which maintains version control over the VHDL files.

From the VHDL files, one or more synthesis tools, e.g., various placement-based or timing-based synthesis tools, may be used to generate netlist files for Random Logic Macros (RLM's) from some or all of the VHDL files. These files are in turn used by one or more integrators in a physical design or layout process 18 to generate a floor plan for the circuit design. The floor plan may be represented, for example, using one or more netlist files, or using other manners of representing physical definitions of a circuit design. In addition to or in lieu of automated synthesis, some or all of the functional definition may be implemented using a custom or semi-custom design style which may be maintained by source code release process 14, and which may be used by integrators during physical design 18 when generating a floor plan for the circuit design.

From the physical definition, represented in netlist format, an overhead logic design process 20 may be used to generate an assignment file including assignments between circuit elements and various signals associated with the overhead logic in the circuit design, e.g., related to the scan architecture. The assignment file may be stored in a database 22, and prior versions of the assignment file may be retrieved from database 22 in connection with generating the assignments in process 20. Process 20 may also be used to generate assignments for other global signals, e.g., functional signals distributed via distribution trees.

The assignment file generated by process 20 may then be used to back annotate the functional definition of the circuit design as shown in block 24. In particular, back annotation process 24 may be used to annotate the VHDL files generated by logic design process 12 with assignments defined in the assignment file. The annotated files are then provided to the source code release process 14 for retention. It will be appreciated that an assignment file may be implemented using any suitable data structure.

It will be appreciated that, using the process illustrated in FIG. 1, assignments made as a result of physical layout may be propagated back into the source VHDL generated by the logic design. Furthermore, modifications made to the physical layout at a later time may also be back annotated to the source VHDL. As also illustrated in FIG. 1, modifications to the functional definition of the circuit design, as shown by the arrow from block 12 to block 24, may also be used to annotate the functional definition of the circuit design.

It will be appreciated that other design processes and methodologies may be utilized in different embodiments of the invention. Moreover, it will be appreciated that various operations within the process may be performed manually or in an automated fashion with the assistance of a computer-implemented tool. It will also be appreciated that back annotation may be performed using an assignment file generated in a manner other than that described herein in connection with overhead logic design process 20. Furthermore, manual back annotation may be used in some embodiments in addition to or in lieu of the automated process described herein. The invention is therefore not limited to the specific embodiments described herein.

Figure 2:
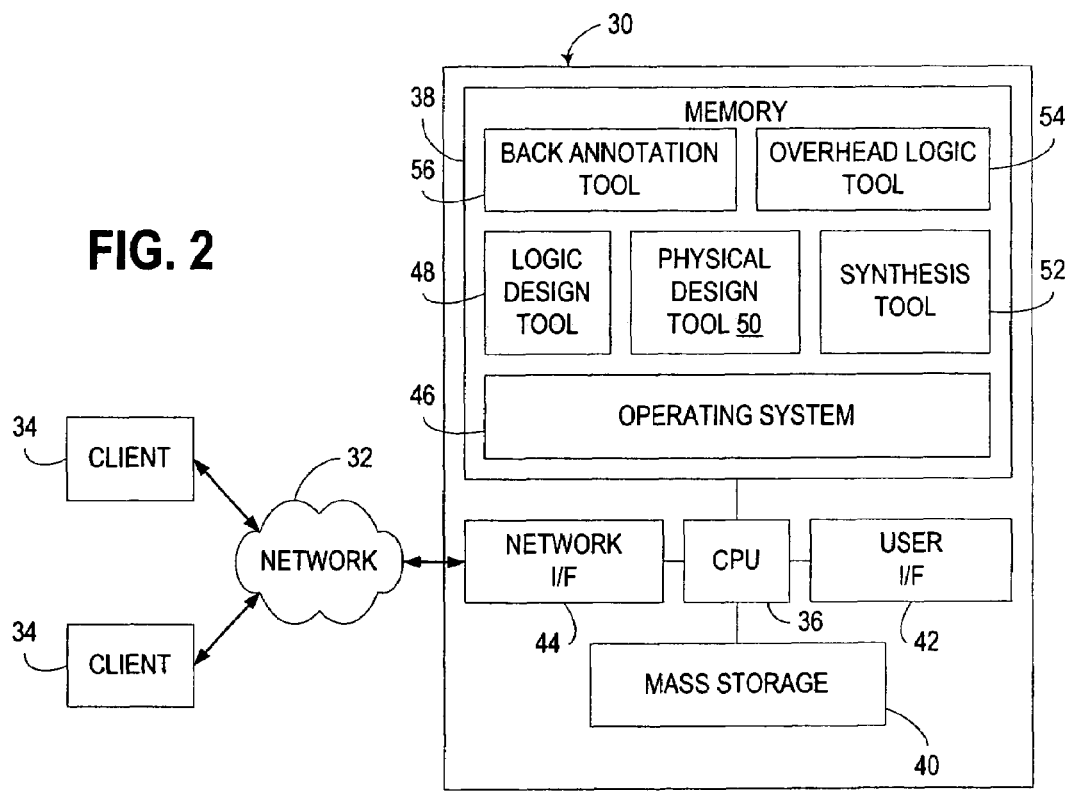
FIG. 2 is a block diagram of the principal hardware components in a computer system suitable for implementing the process of FIG. 1.

FIG. 2 next illustrates an apparatus 30 within which the various steps in process 10 may be performed. Apparatus 30 in the illustrated embodiment is implemented as a server or multi-user computer that is coupled via a network 32 to one or more client computers 34. For the purposes of the invention, each computer 30, 34 may represent practically any type of computer, computer system or other programmable electronic device. Moreover, each computer 30, 34 may be implemented using one or more networked computers, e.g., in a cluster or other distributed computing system. In the alternative, computer 30 may be implemented within a single computer or other programmable electronic device, e.g., a desktop computer, a laptop computer, a handheld computer, a cell phone, a set top box, etc.

Computer 30 typically includes a central processing unit 36 including at least one microprocessor coupled to a memory 38, which may represent the random access memory (RAM) devices comprising the main storage of computer 30, as well as any supplemental levels of memory, e.g., cache memories, non-volatile or backup memories (e.g., programmable or flash memories), read-only memories, etc. In addition, memory 38 may be considered to include memory storage physically located elsewhere in computer 30, e.g., any cache memory in a processor in CPU 36, as well as any storage capacity used as a virtual memory, e.g., as stored on a mass storage device 40 or on another computer coupled to computer 30. Computer 30 also typically receives a number of inputs and outputs for communicating information externally. For interface with a user or operator, computer 30 typically includes a user interface 42 incorporating one or more user input devices (e.g., a keyboard, a mouse, a trackball, a joystick, a touchpad, and/or a microphone, among others) and a display (e.g., a CRT monitor, an LCD display panel, and/or a speaker, among others). Otherwise, user input may be received via another computer or terminal.

For additional storage, computer 30 may also include one or more mass storage devices 40, e.g., a floppy or other removable disk drive, a hard disk drive, a direct access storage device (DASD), an optical drive (e.g., a CD drive, a DVD drive, etc.), and/or a tape drive, among others. Furthermore, computer 30 may include an interface 44 with one or more networks 32 (e.g., a LAN, a WAN, a wireless network, and/or the Internet, among others) to permit the communication of information with other computers and electronic devices. It should be appreciated that computer 30 typically includes suitable analog and/or digital interfaces between CPU 36 and each of components 38, 40, 42 and 44 as is well known in the art. Other hardware environments are contemplated within the context of the invention.

Computer 30 operates under the control of an operating system 46 and executes or otherwise relies upon various computer software applications, components, programs, objects, modules, data structures, etc., as will be described in greater detail below. Moreover, various applications, components, programs, objects, modules, etc. may also execute on one or more processors in another computer coupled to computer 30 via network 32, e.g., in a distributed or client-server computing environment, whereby the processing required to implement the functions of a computer program may be allocated to multiple computers over a network.

In general, the routines executed to implement the embodiments of the invention, whether implemented as part of an operating system or a specific application, component, program, object, module or sequence of instructions, or even a subset thereof, will be referred to herein as "computer program code," or simply "program code." Program code typically comprises one or more instructions that are resident at various times in various memory and storage devices in a computer, and that, when read and executed by one or more processors in a computer, cause that computer to perform the steps necessary to execute steps or elements embodying the various aspects of the invention. Moreover, while the invention has and hereinafter will be described in the context of fully functioning computers and computer systems, those skilled in the art will appreciate that the various embodiments of the invention are capable of being distributed as a program product in a variety of forms, and that the invention applies equally regardless of the particular type of computer readable media used to actually carry out the distribution. Examples of computer readable media include but are not limited to tangible, recordable type media such as volatile and non-volatile memory devices, floppy and other removable disks, hard disk drives, magnetic tape, optical disks (e.g., CD-ROMs, DVDs, etc.), among others, and transmission type media such as digital and analog communication links.

In addition, various program code described hereinafter may be identified based upon the application within which it is implemented in a specific embodiment of the invention. However, it should be appreciated that any particular program nomenclature that follows is used merely for convenience, and thus the invention should not be limited to use solely in any specific application identified and/or implied by such nomenclature. Furthermore, given the typically endless number of manners in which computer programs may be organized into routines, procedures, methods, modules, objects, and the like, as well as the various manners in which program functionality may be allocated among various software layers that are resident within a typical computer (e.g., operating systems, libraries, API's, applications, applets, etc.), it should be appreciated that the invention is not limited to the specific organization and allocation of program functionality described herein.

To implement the various activities in process 10 of FIG. 1, computer 30 includes a number of software tools, including, for example, a logic design tool 48, a physical design tool 50, and a synthesis tool 52, as well as a overhead logic tool 54 and a back annotation tool 56 suitable for implementing automated back annotation consistent with the invention. Other tools utilized in connection with integrated circuit design, verification and/or testing may also be utilized in computer 30. Moreover, while tools 48-56 are shown in a single computer 30, it will be appreciated by one of ordinary skill in the art having the benefit of the instant disclosure that typically these tools will be disposed in separate computers, particularly where multiple individuals participate in the logic design, integration and verification of an integrated circuit design. Therefore, the invention is not limited to the single computer implementation that is illustrated in FIG. 2.

Those skilled in the art will recognize that the exemplary environment illustrated in FIGS. 1 and 2 is not intended to limit the present invention. Indeed, those skilled in the art will recognize that other alternative hardware and/or software environments may be used without departing from the scope of the invention.

Figure 3:
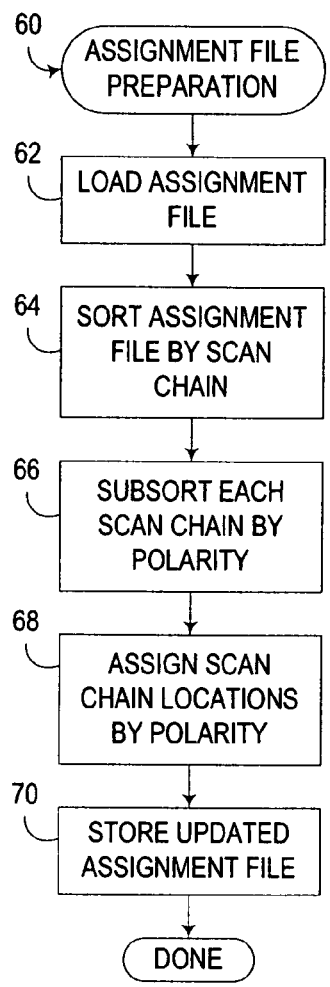
FIG. 3 is a flowchart illustrating the program flow of an assignment file preparation routine performed by the back annotation tool referenced in FIG. 2.
Figure 4:
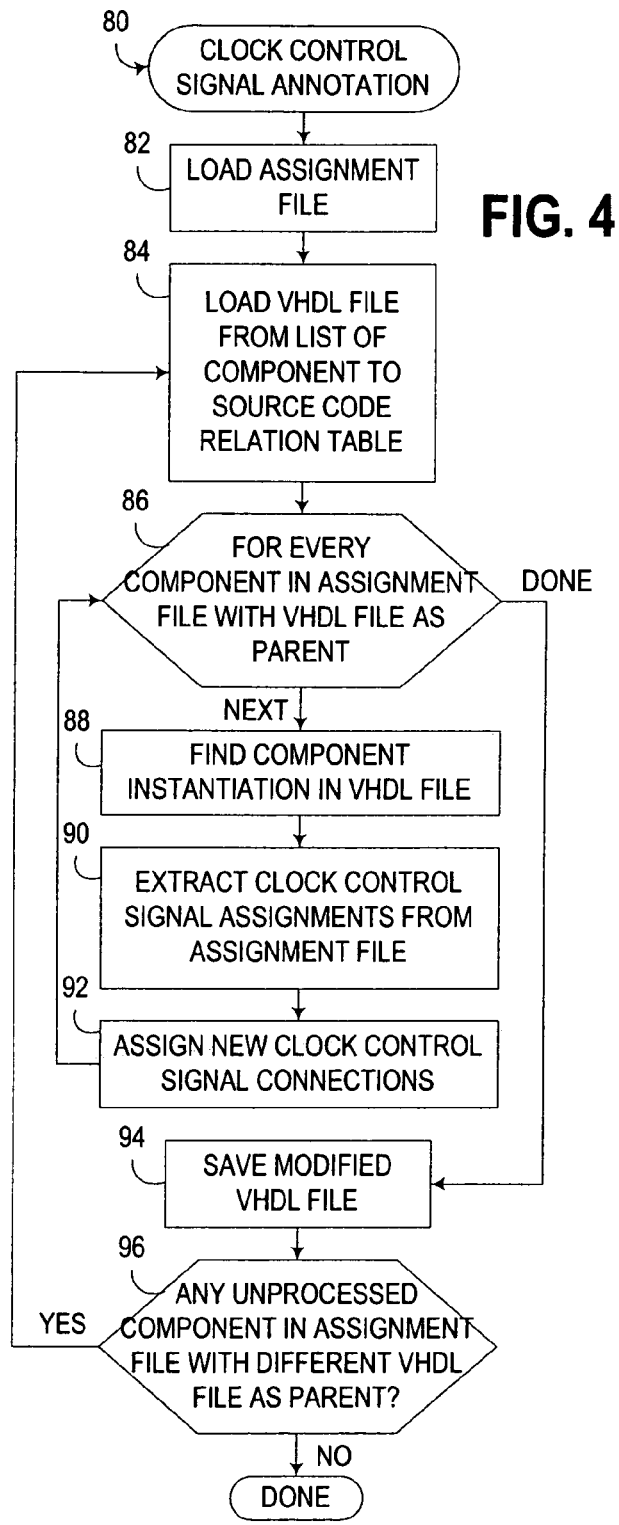
FIG. 4 is a flowchart illustrating the program flow of a clock control signal annotation routine performed by the back annotation tool referenced in FIG. 2.
Figure 5:
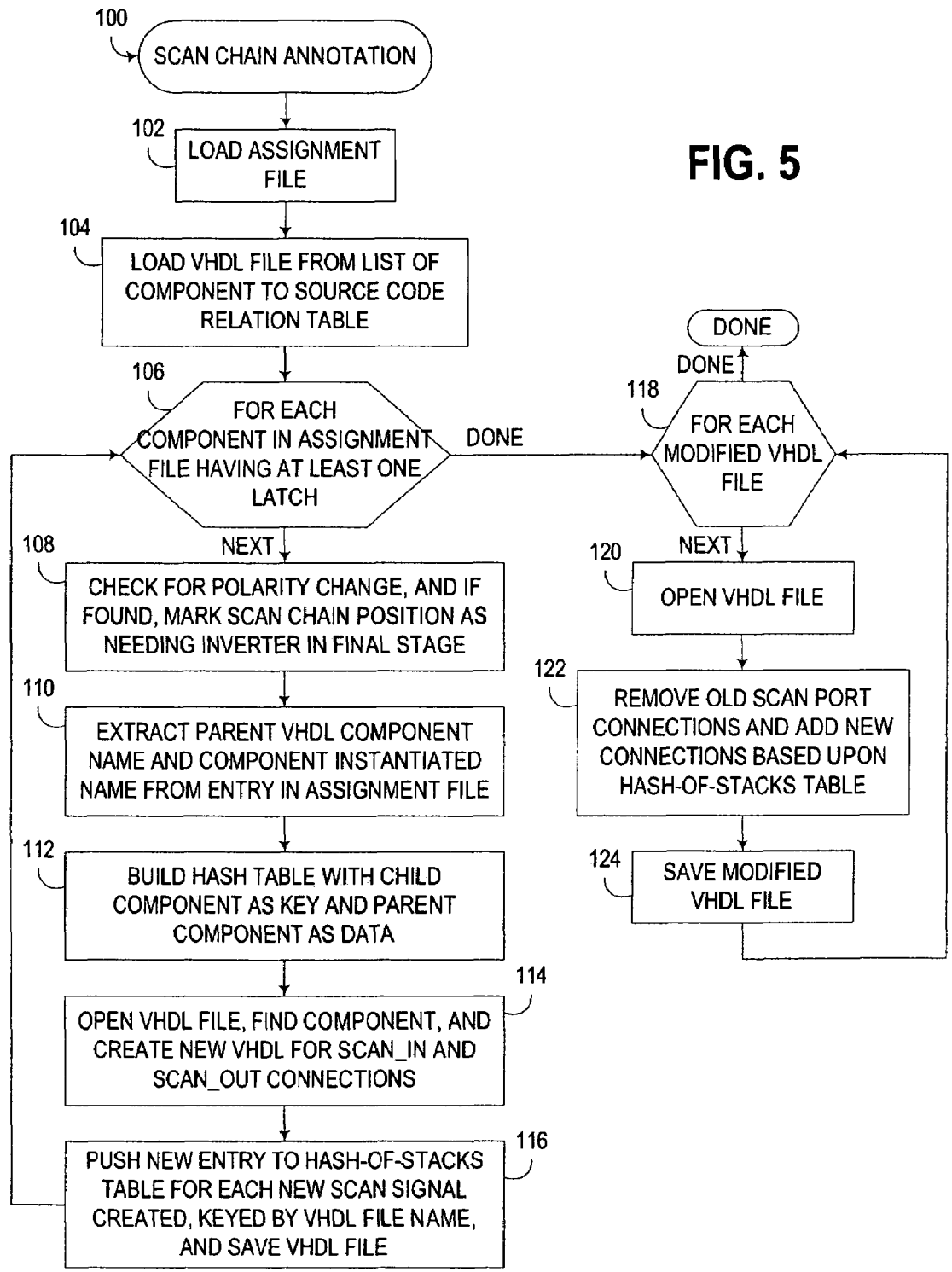
FIG. 5 is a flowchart illustrating the program flow of a scan chain annotation routine performed by the back annotation tool referenced in FIG. 2.

FIGS. 3-5 next illustrate various steps performed in a back annotation process utilizing back annotation tool 56 referenced in FIG. 2. As noted above, back annotation takes information from a physical definition of a circuit design and back annotates the information into the original functional definition thereof. To perform such back annotation the herein-described process, an assignment file is generated, which includes assignments of circuit elements defined in the functional definition to particular overhead circuitry and/or other global signals. In the herein-described embodiment, for example, an assignment file includes assignments of scan-enabled latches in a circuit design to specific locations in one of a plurality of scan chains, as well as assignments of such latches to specific endpoints in one or more clock control distribution trees associated with a scan architecture. For example, clock control signals distribution trees may be defined for thold and scangate signals, the former of which used to effectively frequency divide the system clock provided to the scan-enabled latches, and the latter of which used to effectively enable/disable portions of a scan architecture through enabling or disabling the clock input to scan-enabled latches.

In addition, in the herein-described embodiment, the functional definition for a circuit design is defined in one or more source VHDL files, while the physical definition is defined in one or more netlist files. The invention, however, is not limited to these particular data formats.

An assignment file used in the herein-described process may be implemented in a number of manners consistent with the invention. For example, an assignment file may incorporate a table of records, with each record identifying a particular cell or circuit element, a cell type, a latch count (representing the number of scan-enabled latches in the cell), a clock domain identifier (representing the clock domain to which the cell belongs), a scan chain identifier, an identifier of a specific position in the assigned scan chain, a mapping to a particular thold distribution tree and endpoint thereon, and a mapping to a particular scangate distribution tree and endpoint thereon.

In addition, each record in an assignment file may include a scan polarity identifier, which represents whether the cell should be initialized with a "0" or "1" value via the scan chain. By identifying polarity, cells may be sorted by polarity to reduce the number of inverters that need to be inserted in a scan chain (representing whether the latch. Other information, such as a parent cell identifier for each cell, among other information, may be incorporated into an assignment file consistent with the invention.

The initial assignments in an assignment file may be generated in a number of manners consistent with the invention. For example, some or all of the assignments may be generated by overhead logic tool 54 using either of the clustering algorithms described in the aforementioned cross-referenced applications. Some assignments may be generated, for example, using a heuristic algorithm that randomly swaps circuit elements between clusters and selectively negates swaps that do not improve a spatial locality metric. Other assignments may be generated, for example, by selectively swapping circuit elements between clusters based upon a trading propensity metric for the circuit elements. Some or all of the assignments may be generated using other algorithms in tool 54, or may be generated manually by a developer.

Once an assignment file is generated, the file is prepared using the assignment file preparation routine 60 illustrated in FIG. 3. Routine 60 begins in block 62 by loading the assignment file from storage. Next, block 64 sorts the records in the assignment file by scan chain such that records for cells assigned to the same scan chain are listed together. Next, block 66 performs a subsort of the records assigned to each scan chain to arrange the records by polarity. Then, in block 68, scan chain locations are assigned for each scan chain to group cells by polarity, e.g., by assigning positions to each cell based upon the sorted records. It should be noted that since scan chain locations are assigned in block 68, the assignment file may not be initially populated with location assignments by overhead logic tool 54.

Once the locations have been assigned, the updated assignment file is stored in block 70, and preparation of the assignment file by routine 60 is complete.

Next, as illustrated in FIG. 4, a clock control signal annotation routine 80 may be executed to annotate the source VHDL for a circuit design with connections to one or more clock control signal distribution trees, e.g., a thold signal tree and a scangate signal tree. Routine 80 begins in block 82 by loading the updated assignment file. Block 84 then loads a VHDL file identified in a List of Component to Source Code Relation table. Specifically, the List of Component to Source Code Relation table may be implemented, for example, by a hash table keyed by component or cell name and including for each such component or cell the name of the parent VHDL file within which the component or cell is defined. The table may be used to identify the parent VHDL file for any circuit element referenced in the assignment file.

The loading of a VHDL file in block 84 may occur, for example, by accessing the table for the first circuit element identified in the assignment file. As will become more apparent below, other circuit elements sharing the same VHDL file may then be processed together such that the VHDL file need only be loaded and saved once. In alternate embodiments, however, circuit elements in the assignment file can be processed sequentially, thus requiring VHDL files to be loaded and stored more frequently.

Next, block 86 initiates a FOR loop to process each component or circuit element in the assignment file having the current VHDL file as its parent. Next, block 88 locates the component instantiation in the VHDL file, and block 90 finds the component in the assignment file and extracts the clock control signal assignments therefrom. Block 92 then assigns the new clock control signal connections in the VHDL file, and passes control back to block 86 to process additional components defined in the same VHDL file. For example, block 92 may modify the component instantiation in the VHDL file to remove or disconnect any signal connections that are obsolete and add or modify any signal connections necessitated by the clock control signal assignments. A common naming convention is typically used to facilitate the generation of connections to the clock control signal distribution trees. Furthermore, removal of obsolete connections may incorporate commenting out any connections using standard VHDL nomenclature.

Returning to block 86, once every component having the current VHDL file as a parent has been processed, control passes to block 94 to save the modified VHDL file. Control then passes to block 96 to determine whether any unprocessed components in the assignment file remain. If so, control passes back to block 84 to load another VHDL file that is the parent of at least one unprocessed component identified in the assignment file. Otherwise, routine 80 is complete.

Next, as illustrated in FIG. 5, a scan chain annotation routine 100 may be executed to annotate the source VHDL for a circuit design with connections to the scan chains defined for the design. Routine 100 begins in block 102 by loading the assignment file, similar to block 82 of FIG. 4. Block 104 then loads a VHDL file identified in a List of Component to Source Code Relation table.

Next, block 106 initiates a FOR loop to process each component or circuit element in the assignment file having at least one scan-enabled latch. For each such component, block 108 checks the polarity for the component for a polarity change from zero to one. If a change is found, the scan chain position is marked as needing an inverter in the final stage. By doing so, the scan chain is effectively broken into two sections, the first having all of latches that should be initialized to zero, and the second having all of the latches that should be initialized to one. To obtain an initial value of one on the second section, an inverter is required to be inserted in the scan path between the two sections, with a final inverter inserted at the end of the scan chain to return the output to zero polarity.

Next, block 110 extracts the parent VHDL component name and component instantiated name from the record in the assignment file, and block 112 builds a hash table with the child component as the key and the parent as the data, whereby the hash table is basically an associative array that identifies the parent for each child component. The hash table is used to maintain connectivity up through the component hierarchy in the VHDL, so any necessary ports can be added up through the top level of the hierarchy, if needed.

Next, block 114 opens the VHDL file, locates the component, and creates new VHDL program code for the scan in and scan out ports for the component.

Next, block 116 pushes a new entry in a hash-of-stacks table or data structure for each new scan signal created, keyed by the VHDL file name, and saves the VHDL file. The hash-of-stacks table may be implemented, for example, using a set of FIFO data structures, with each such data structure mapped to a particular VHDL file name, so that scan signals can be associated with specific VHDL files by pushing those signals onto the associated FIFO data structure for the VHDL file. By doing so, the location of the signal in the source VHDL can be quickly ascertained during a later stage of processing.

Block 116 passes control to block 106 to process any other components in the assignment table having at least one latch. Once all such components have been processed, block 106 passes control to block 118 to initiate a FOR loop that processes each modified VHDL file. For each such VHDL file, block 120 opens the file. Block 122 then removes the old scan in and scan out port connections (e.g., via commenting out the connections) and adds new connections based upon the signals pushed onto the hash-of-stacks table. Block 122 may also be used to propagate ports up through the hierarchy as needed. Block 124 then saves the modified VHDL file, and returns control to block 118 to process additional modified VHDL files. Once all such files have been processed, annotation is complete.

The incorporation of the connections to clock control signal distribution trees and scan chains as identified in the assignment file into VHDL-formatted files is well within the abilities of one of ordinary skill in the art having the benefit of the instant disclosure. In addition, it will be appreciated that the precise manner in which these operations may be performed in a computer environment may differ in different embodiments.

Figure 6:
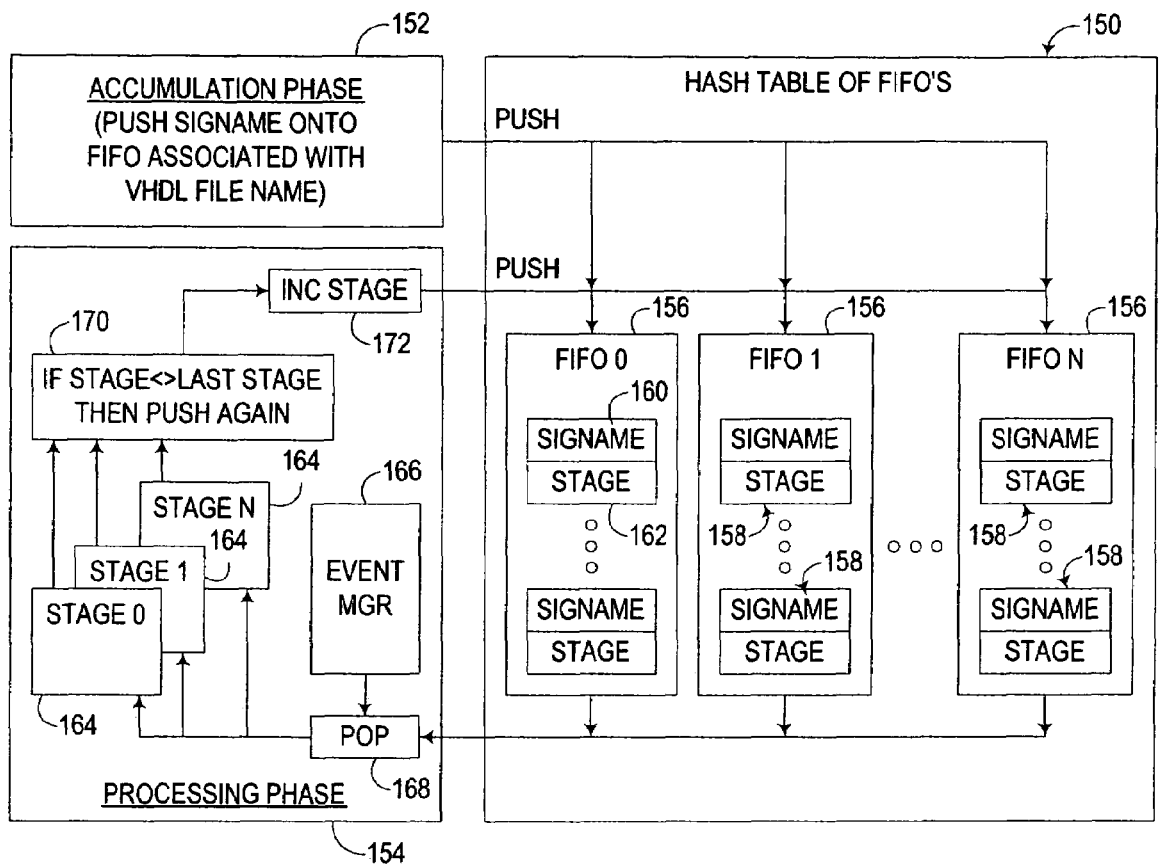
FIG. 6 is a block diagram of an execution architecture suitable for implementing back annotation in a manner consistent with the invention.

For example, FIG. 6 illustrates an exemplary execution architecture 150 that may be used to implement back annotation as described herein. In particular, architecture 150 is illustrated as including an accumulation phase 152 and a processing phase 154. The accumulation phase is used to push signal names (signames) onto a set of FIFO data structures 156 collectively implementing the aforementioned hash-of-stacks table data structure used in routine 100 of FIG. 5. Each FIFO 156 is mapped to a specific VHDL file, and is used to store signal records 158, each including a signame identifier field 160, which identifies a signal name being processed, and a stage field 162, which identifies a stage of execution for that signal name.

Processing phase 154 includes a set of stages 164, which are respectively configured to perform sequential operations on each signal name. An event manager 166 controls a pop block 168, which selectively pops signal records 158 off of each FIFO 156 and passes the signal records to the appropriate stage for processing, based upon the signal field 162 in each signal record 158. A decision block 170 determines whether a signal record 158 processed by a stage 164 has reached its last stage of processing, and if not, passes the signal record to an increment stage block 172, which increments the stage field 162 in the signal record 158 prior to pushing the record back onto the appropriate FIFO 156. Event manager 166 may utilize any number of scheduling algorithms to pop signal records off FIFO's 156, e.g., round-robin, random, etc.

Execution architecture 150 is well suited to apply common changes to multiple records that don't need to be executed in any particular order, and in this regard, stages 164 may be used to perform practically any number of operations that may be required to apply any number of different changes to a circuit design, whether or not related to back annotation of a circuit design. Moreover, records 158 may identify other entities in a circuit design, and may be partitioned into groups on bases other than parent VHDL file.

However, in the herein-described embodiment, execution architecture 150 is specifically configured to perform a number of the annotation operations in routines 80 and 100 of FIGS. 4 and 5. The execution architecture, in this regard, enables changes to VHDL program code to be accumulated and stored in memory, without having to save the VHDL file after every change. With each signal name represented by a record, each signal has stages or a life cycle that it has to proceed through, e.g., in a first stage, adding a new signal to the signal list, in a second stage, deleting a previous signal from the signal list, in a third stage commenting out the old signal from the component instantiation, and in a fourth stage adding the new signal to the component instantiation.

Thus, for example, at least blocks 88-92 of routine 80 may be implemented using the aforementioned architecture, as may a number of the blocks in routine 100. However, the architecture is not limited to performing this particular back annotation algorithm, and has other uses in connection with applying common changes to circuit entities in a circuit design. Among other benefits, the architecture is well suited for implementation in a multi-processor environment, whereby different processors and/or different machines may handle different stages of execution.

Various modifications may be made to the illustrated embodiments without departing from the spirit and scope of the invention. For example, in a circuit design based upon hierarchical HDL, some design components may be designed once and used multiple times. In a hierarchical design the lower-level components can be called "children" if they are instantiated into higher-level components. Multiple usage of a logic block may occur when a child is designed once but used (instantiated) multiple times in the same design. Since these components are only designed once, there is only one HDL file describing that component. That same HDL component is then called out multiple times in the higher-level HDL.

If assignments are made during back annotation to the specific ports on the components, multiple usage of a logic block may preclude connections being annotated into some components due to the fact that multiple components, having different ports, may be defined by the same HDL component. As a result, a back annotation algorithm may be used in which assignments for multiple use components are made at higher levels in the HDL, where the children are used, instead of propagating those assignments down into the HDL descriptions of the children themselves. In other words, the algorithm described above generally traverses the HDL hierarchy from parents to children, propagating assignments onto component ports at each level, such that the assignments become part of the HDL design description at each level. The algorithm may be modified to support multiple usage of a logic block by modifying this hierarchy traversal to stop at the usage of any multiple usage component (or optionally any component) and apply the assignment to the component usage in the higher-level HDL instead of diving into the HDL description of the child components themselves.

As another example, the algorithm described above is configured to read the scan polarity of an HDL component out of the assignment file. An alternative approach may use a convention in the port names of the components themselves. For example, port names such as "scan_in", "scan_out", "si", and "so" may indicate that the circuit element requires positive scan polarity. Conversely, port names such as "scan_in_bar", "scan_out_bar", "si_bar", and "so_bar" may be used to indicate that negative scan polarity is needed. As the scan chain is connected, no inversion would be required to connect a positive scan output port to a positive scan input port. (scan_in<-scan_out). Likewise negative scan output ports may drive negative scan input ports without inversion. An inversion would be required to connect a positive scan output port to a negative scan input port. (scan_in_bar<-inv<-scan_out). An inversion would also be required to connect a negative scan output port to a positive scan input port. These inversions may be inserted automatically by the algorithm, based on the port name conventions, as the scan chain is built.

Various additional modifications to the herein-described embodiments will be apparent to one of ordinary skill in the art having the benefit of the instant disclosure. Therefore, the invention lies in the claims hereinafter appended.

What is claimed is:

1. A method of annotating a functional definition of a circuit design, the method comprising:
using a physical definition of the circuit design that has been generated from the functional definition, generating a plurality of assignments between a plurality of circuit elements in the circuit design and a plurality of signals defined for the circuit design; and
automatically modifying the functional definition of the circuit design to incorporate the plurality of assignments into the functional definition;
wherein the plurality of assignments includes a first assignment configured to couple a first circuit element among the plurality of circuit elements to a first signal among the plurality of signals, wherein the first circuit element is defined in a first HDL file among a plurality of HDL files in the functional definition, and wherein modifying the functional definition of the circuit design to incorporate the plurality of assignments into the functional definition includes, for at least the first assignment:
storing a record associated with the first assignment in a first data structure associated with the first HDL file, wherein the first data structure is among a plurality of data structures respectively associated with the plurality of HDL files;
associating a stage identifier with the record in the first data structure, wherein the stage identifier identifies an initial execution stage among a plurality of execution stages;
processing the record by retrieving the record from the first data structure and passing the record to the execution stage among the plurality of execution stages that is identified by the stage identifier for the record; and
after processing the record, and until the stage identifier for the record indicates that the record has been processed by all of the execution stages, repeatedly:
incrementing the stage identifier for the record to identify a next execution stage among the plurality of execution stages;
storing the record back in the first data structure; and
repeating processing of the record by retrieving the record from the first data structure and passing the record to the execution stage among the plurality of execution stages that is identified by the stage identifier for the record.

2. The method of claim 1, wherein at least one assignment comprises a global signal assignment that connects a circuit element among the plurality of circuit elements to a global signal in the circuit design.

3. The method of claim 2, wherein a first circuit element among the plurality of circuit elements includes a latch configured for use in a scan chain, wherein the global signal comprises a clock control signal distributed via a distribution tree that includes a plurality of endpoints, and wherein the global signal assignment comprises a clock control signal assignment configured to connect the first circuit element to an endpoint of the distribution tree.

4. The method of claim 3, wherein the plurality of assignments are defined in an assignment file, and wherein automatically modifying the functional definition of the circuit design to incorporate the plurality of assignments includes:
locating an instantiation of the first circuit element in a Hardware Description Language (HDL) representation of the functional definition;
retrieving the clock control signal assignment for the first circuit element from the assignment file; and
modifying the HDL representation to connect the first circuit element to the endpoint in the distribution tree identified by the clock control signal assignment.

5. The method of claim 1, wherein a first circuit element among the plurality of circuit elements includes a latch configured for use in a scan chain, and wherein at least one assignment comprises a scan chain assignment that connects the first circuit element to one of a plurality of scan chains.

6. The method of claim 5, wherein the scan chain assignment assigns the first circuit element to a designated position in one of a plurality of scan chains.

7. The method of claim 5, wherein the plurality of assignments are defined in an assignment file, and wherein automatically modifying the functional definition of the circuit design to incorporate the plurality of assignments includes:
- locating an instantiation of the first circuit element in a Hardware Description Language (HDL) representation of the functional definition; and
- modifying the instantiation of the first circuit element in the HDL representation to add scan in and scan out port connections for the first circuit element based upon the scan chain assignment.

8. The method of claim 7, wherein the HDL representation of the functional definition includes a plurality of HDL files, wherein the first circuit element is defined in a first HDL file among the plurality of HDL files, and wherein automatically modifying the functional definition of the circuit design to incorporate the plurality of assignments further includes:
- adding a port for the first circuit element for each new port connection added when modifying the instantiation of the first circuit element to a data structure that is associated with the first HDL file; and
- processing each HDL file among the plurality of files that has been modified to remove any old port connections and add any new port connections identified in the data structure associated with each such HDL file.

9. The method of claim 7, wherein automatically modifying the functional definition of the circuit design to incorporate the plurality of assignments further includes determining from the assignment file whether a polarity change is associated with the first circuit element and inserting an invertor at a scan chain position associated with the first circuit element.

10. The method of claim 9, wherein determining whether a polarity change is associated with the first circuit element includes determining a polarity associated with a port on the first circuit element from a name associated with the port.

11. The method of claim 1, wherein automatically modifying the functional definition of the circuit design to incorporate the plurality of assignments into the functional definition includes precluding propagation of an assignment into a child of a circuit element in response to detecting that the circuit element is a multiple usage circuit element.

12. The method of claim 1, wherein generating the plurality of assignments includes generating at least one assignment manually.

13. The method of claim 1, wherein generating the plurality of assignments includes at least one of generating at least one assignment automatically using a heuristic algorithm or generating at least one assignment that assigns a circuit element to one of a plurality of clusters by selectively swapping the circuit element between clusters based upon a trading propensity metric for the circuit element.

14. The method of claim 1, wherein the plurality of assignments are defined in an assignment file, wherein the plurality of assignments includes a plurality of scan chain assignments that assign circuit elements to one of a plurality of scan chains, and wherein the method further comprises preparing the assignment file by sorting the plurality of scan chain assignments by scan chain.

15. The method of claim 14, wherein the assignment file includes a polarity for each circuit element assigned to a scan chain by a scan chain assignment, and wherein the method further comprises subsorting the plurality of scan chain assignments by polarity.

16. The method of claim 14, further comprising assigning a scan chain position to each circuit element assigned to a scan chain by a scan chain assignment.

17. The method of claim 14, wherein automatically modifying the functional definition of the circuit design to incorporate the plurality of assignments includes commenting out at least one obsolete connection from the functional definition.

18. A computer-implemented method of applying common changes to a plurality of records, the method comprising, for each of a plurality of records:
- storing the record in a selected data structure among a plurality of data structures;
- associating a stage identifier with the record in the selected data structure, wherein the stage identifier identifies an initial execution stage among a plurality of execution stages;
- processing the record by retrieving the record from the selected data structure and passing the record to the execution stage among the plurality of execution stages that is identified by the stage identifier for the record; and
- after processing the record, and until the stage identifier for the record indicates that the record has been processed by all of the execution stages, repeatedly:
  - incrementing the stage identifier for the record to identify a next execution stage among the plurality of execution stages;
  - storing the record back in the selected data structure; and
  - repeating processing of the record by retrieving the record from the selected data structure and passing the record to the execution stage among the plurality of execution stages that is identified by the stage identifier for the record,
- wherein the record is associated with an assignment made between a circuit element and a signal defined in a circuit design, and wherein at least a subset of the plurality of execution stages are configured to modify a functional definition of the circuit design to incorporate the assignment into the functional definition.

* * * * *